(12) United States Patent
Krishnamurthy et al.

(10) Patent No.: US 6,346,831 B1
(45) Date of Patent: Feb. 12, 2002

(54) NOISE TOLERANT WIDE-FANIN DOMINO CIRCUITS

(75) Inventors: Ram K. Krishnamurthy, Beaverton, OR (US); Lei Wang; Rajamohana Hegde, both of Urbana, IL (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/408,190

(22) Filed: Sep. 28, 1999

(51) Int. Cl.[7] ............... H03K 19/096; H03K 19/094

(52) U.S. Cl. ............................... 326/98; 326/105

(58) Field of Search ..................... 326/93, 95, 98, 326/104, 112, 119, 121; 327/534

(56) References Cited

U.S. PATENT DOCUMENTS

| | | | |
|---|---|---|---|
| 5,461,338 A | 10/1995 | Hirayama et al. | 327/534 |
| 5,483,181 A | 1/1996 | D'Souza | 326/98 |
| 5,854,561 A * | 12/1998 | Arimoto et al. | 327/534 |
| 5,917,365 A * | 6/1999 | Houston | 327/534 |
| 6,049,230 A * | 4/2000 | Durham et al. | 326/98 |
| 6,097,113 A * | 8/2000 | Teraoka et al. | 307/125 |

FOREIGN PATENT DOCUMENTS

JP     354000968 A   *   1/1979

OTHER PUBLICATIONS

P. Larsson et al, "Noise in Digital Dynamic CMOS Circuits," IEEE Journal of Solid-State Circuits, vol. 29, No. 6 Jun. 1994, pp. 655–662.

K. Shepard et al., "Noise in Deep Submicron Digital Design," ICCAD '96, pp. 524–531, 1996.

S. Shigematsu et al, "A 1-V High-Speed MTCMOS Circuits Scheme for Power-Down Application Circuits," IEEE Journal of Solid-State Circuits, vol. 32, No. 6, Jun. 97, pp 861–69.

Z. Wang et al, "Fast Adders Using Enhanced Multiple-Output Domino Logic," IEEE Journal of Solid-State Circuits, vol. 32, No. 2, Feb. 1997, pp. 206–214.

Y. Nakagome et al, "Sub-1-V Swing Internal Bus Architecture for Future Low-Power ULSI's", IEEE Journal of Solid-State Circuits, vol. 28, No. 4, Apr. 1993, pp. 414–419.

(List continued on next page.)

*Primary Examiner*—Michael Tokar
*Assistant Examiner*—James H. Cho
(74) *Attorney, Agent, or Firm*—Alan K. Aldous (57) ABSTRACT

The invention involves a die having domino circuits. In some embodiments, at least some of the domino circuits include an output stage and a domino stage including a domino stage output node coupled to the output stage. The domino stage includes a wide-fanin evaluate network including the domino stage output node and at least one intermediate node. The domino stage has improved noise immunity and reduced leakage through reverse body biasing transistors in the evaluate network by raising voltage of the at least one intermediate node without static power consumption through the evaluate network. In other embodiments, at least some of the domino circuits include an output stage and a domino stage including a domino stage output node coupled to the output stage. The domino stage includes a wide-fanin evaluate network including the domino stage output node and wherein the domino stage further includes a diode transistor having a gate and an additional terminal connected to the domino stage output node. The diode transistor may resist leakage by operating in a subthreshold region to replenish charge on the domino stage output node and resists noise by turning on when small amounts of noise barely turn on transistors of the evaluate network.

22 Claims, 6 Drawing Sheets

OTHER PUBLICATIONS

H. Zhang et al, "Low–Swing Interconnect Interface Circuits," Proceedings of Int'l Symp. On Low Power Electronics and Design, Aug. 10, 1998, pp. 161–166.

N. Weste et al, "Principles of CMOS VLSI Design" (Addison–Wesley 2nd Edition, 1993), pp. 308–311.

T. Sakurai et al, "Low–Power CMOS Design through Vth Control and Low–Swing Circuits," Proceedings of Int'l Symp. On Low Power Electronics and Design, Aug. 18, 1997, pp. 1–6.

* cited by examiner

NOISE TOLERANT WIDE-FANIN DOMINO CIRCUITS

BACKGROUND OF THE INVENTION

1. Technical Field of the Invention

The present invention relates to circuits and, more particularly, to domino circuits.

2. Background Art

Technology scaling combined with aggressive design practices have made high performance digital circuits more susceptible to deep submicron noise. Among various noise disturbances, one major concern is leakage current degradation, which can become substantial in sub-1V, 0.1 $\mu$m technologies. This is primarily because the reduced supply voltage and high speed requirements force designers to use low threshold voltage (Vt) transistors. Reducing threshold voltage, on the other hand, increases the leakage current exponentially. Large leakage current results in higher DC offsets at the inputs of wide domino circuits, degrading the noise tolerance. The term noise immunity refers to the degree to which a circuit is noise tolerant.

Wide-fanin gates are gates having numerous input ports. Wide-fanin gates are routinely employed on critical delay paths of high-performance datapaths, such as in a microprocessor, digital signal processor, or other semiconductor device. Dynamic/Domino logic techniques have been used to achieve substantially higher performance than are provided by static complementary metal oxide semiconductor (CMOS) technology for wide-fanin gates.

Figure 1:
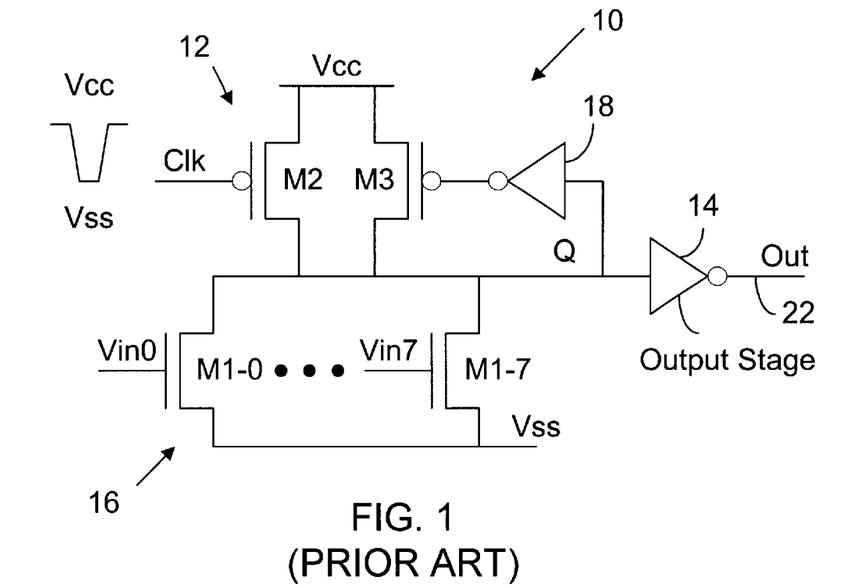
FIG. 1 is a schematic representation of a prior art domino circuit.

As an example, FIG. 1 illustrates a conventional prior art wide-fanin OR domino gate or circuit 10 having a domino stage 12 and an output stage 14 joined by a node Q which carries a domino stage output signal. Domino stage 12 includes an evaluate network 16, precharge and keeper p-channel metal oxide semiconductor field effect transistors (PMOSFET) M2 and M3 and an inverter 18. Output stage 14 is illustrated as an inverter, but may be a dual function generator or other output stage. Evaluate network 16 includes eight n-channel metal oxide semiconductor field effect transistors (NMOSFET) M1-0 . . . M1-7, the gates of which receive corresponding input signals Vin0 . . . Vin7. A wide-fanin gate may have a greater or lesser number of inputs.

During a precharge phase, input signals Vin0 . . . Vin7 and a clock signal (Clk) are low (Vss). When Clk goes low, pull-up PMOSFET M2 is turned ON and node Q is pulled high to a power supply node Vcc (sometimes called Vdd). As signal Q goes high, an inverter 18 turns on PMOSFET M3 which keeps signal Q high after Clk transitions high and PMOSFET M2 is off. During an evaluate phase, if each input remains low, Q remains high and the output signal Out at the output conductor 22 of output stage 14 remains low. If one or more of input signals Vin0 . . . Vin7 goes high, the corresponding NMOSFET(s) M1-0 . . . M1-7 is turned ON pulling signal Q low. When signal Q goes low, Out on conductor 22 goes high.

To improve noise tolerance, NMOSFETs M1-0 . . . M1-7 have a high Vt so that a greater noise voltage is required to turn on the transistor. However, this sacrifices pull-down speed. To enable the use of low Vt transistors for high speed, certain noise tolerance mechanisms have been proposed.

Figure 2:
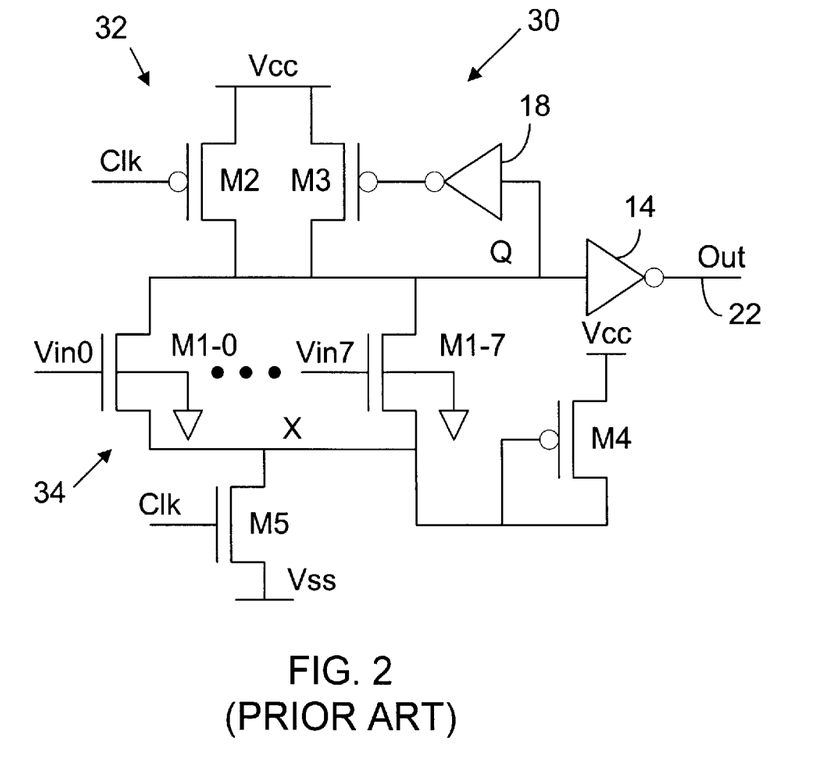
FIG. 2 is a schematic representation of another prior art domino circuit.

One such noise tolerant technique is illustrated in FIG. 2. Referring to FIG. 2, a domino circuit 30 includes a domino stage 32 and an output stage 14. Evaluate network 34 includes NMOSFET M1-0 . . . M1-7, the gates of which receive corresponding input signals Vin0 . . . Vin7. The sources of M1-0 . . . M1-7 are at a node X. A pull-up PMOSFET diode M4 increases the source potential (node X) of evaluate network 34. An NMOSFET M5 isolates node X from ground during the evaluate stage. The Vt of an NMOSFET increases when it is reverse body biased, which occurs when the source voltage is greater than the body voltage. NMOSFET M1-0 . . . M1-7 have a grounded body. A reverse body bias, and hence increase in Vt, is created in NMOSFETs M1-0 . . . M1-7, when node X is greater than ground, thus reducing the domino precharge node dip. Leakage is reduced when two off NMOSFET transistors are stacked in series. During evaluate stage, leakage through evaluate network 34 is reduced because NMOSFET M5 is stacked when M1-0 . . . M1-7, respectively. While circuit 30 is easy to implement, it suffers from a large static power dissipation through M4 and M5 during the evaluate phase.

Accordingly, there is a need for a better noise tolerant wide-fanin domino circuit technique.

SUMMARY

The invention involves a die having domino circuits. In some embodiments, at least some of the domino circuits include an output stage and a domino stage including a domino stage output node coupled to the output stage. The domino stage includes a wide-fanin evaluate network including the domino stage output node and at least one intermediate node. The domino stage has improved noise immunity and reduced leakage through reverse body biasing transistors in the evaluate network by raising voltage of the at least one intermediate node without static power consumption through the evaluate network.

In other embodiments, at least some of the domino circuits include an output stage and a domino stage including a domino stage output node coupled to the output stage. The domino stage includes a wide-fanin evaluate network including the domino stage output node and wherein the domino stage further includes a diode transistor having a gate and an additional terminal connected to the domino stage output node.

Still other embodiments are described and claimed.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

The present invention involves noise tolerant domino circuits. Various embodiments of the invention fall into three categories (1) domino circuits with a boosted source and a dual function generator, (2) domino circuits with a dual stack evaluate network, and (3) domino circuits with a diode pull-up at the output of the domino stage. In some embodiments, there is no static power consumption. In other embodiments, there is no static power consumption during the precharge phase and a relatively small amount of static power consumption during evaluate. In some embodiments, leakage is reduced through stacked transistors.

A. Embodiments with boosted source and a dual function generator

In some embodiments, the invention includes a boosted source evaluate network in combination with a dual function generator (DFG), which provides true and complementary output signals Vout and Vout*. For example, referring to FIG. 3, a boosted source wide-fanin domino OR circuit 50 includes a domino stage 54 and a DFG output stage 62. Domino stage 54 includes an evaluate network 58 having a node Q. Node Q is an output of domino stage 54 and a signal on node Q is a domino stage output signal.

Figure 3:
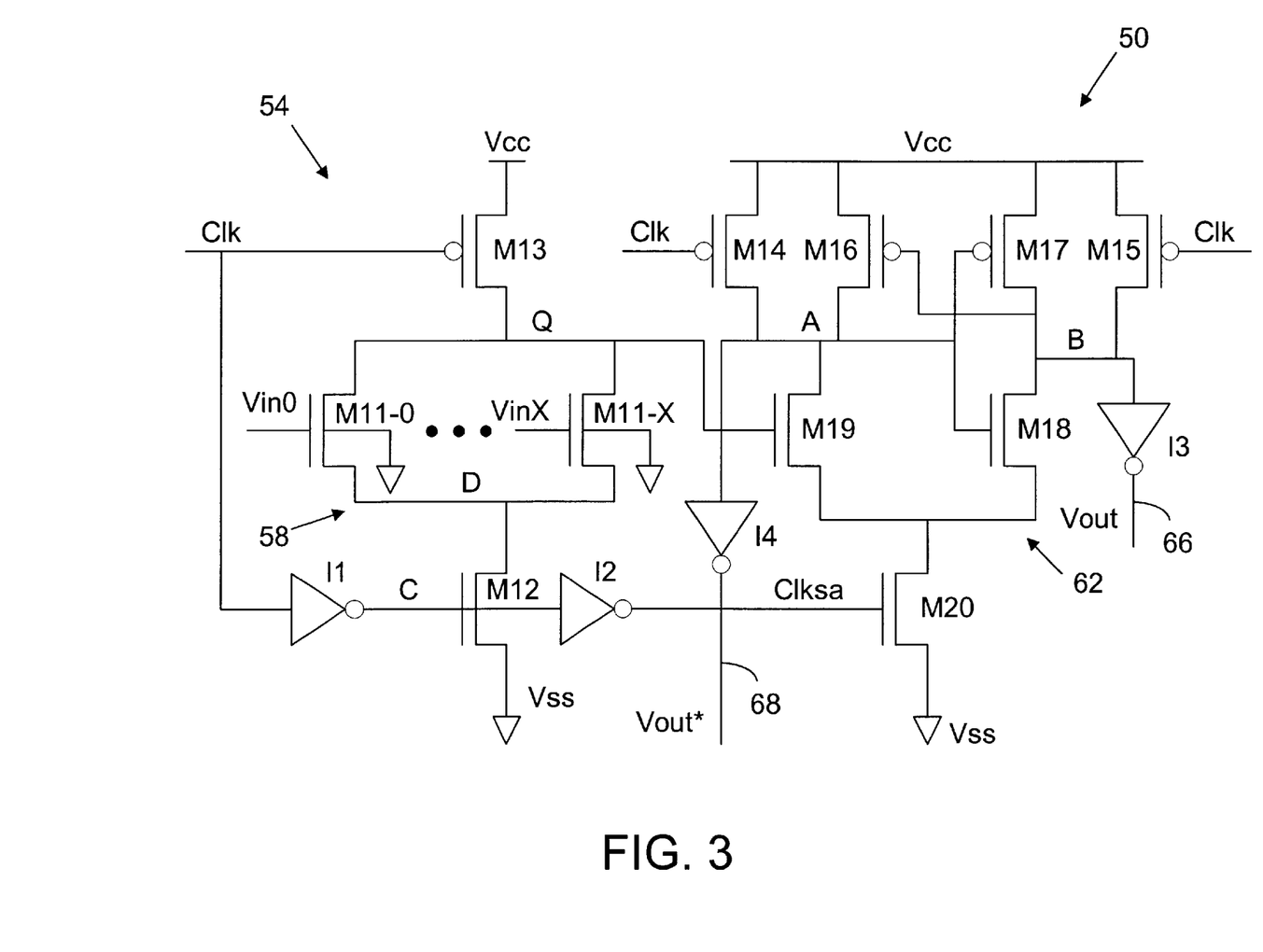
FIG. 3 is a schematic representation of a domino circuit with a boosted source and a dual function generator according to some embodiments of the invention.

Evaluate network 58 includes n-channel field effect transistors (NFETs) (e.g., NMOSFETs) M11-0 . . . M11-X, the gates of which receive data input signals Vin0 . . . VinX, respectfully. Node D is a source node because it is at the sources of transistors M11-0 . . . M11-X. Node D may also be called an intermediate node because it is between transistors Ml1-0 . . . M11-X and a boost NFET transistor M12. Transistor M12 is called a boost transistor because it helps boost the voltage of node D. In the illustrated embodiment, the body (or bodies) of transistors M11-0 . . . M11-X are at ground (Vss), although they could be at another voltage bias. Although there is no single definition of wide-fanin, as used herein wide-fanin means at least four inputs. For example, X may be 7, such that circuit 50 is an 8-wide OR gate, or X may be more or less than 7. A wider fanin tends to result in greater power consumption and noise sensitivity problems. Although the boosted source domino circuit is illustrated as an OR gate, those skilled in the art having the benefit of this disclosure could easily implement it in other logic forms such as AND, NOR, and NAND.

During a precharge phase, a clock signal (Clk) goes low turning on a p-channel field effect transistors (PFETs) (e.g., PMOSFETs) M13, M14 and M15 to precharge nodes A, B, and Q high with a supply voltage (e.g., Vcc which is sometimes called Vdd). Input signals Vin0. . . VinX are low during precharge so that, absent noise, transistors M11-0 . . . M11-X are off. The Clk signal is inverted through an inverter I1 to produce a slightly delayed inverted clock signal at node C. Node C is at the gate of NFET M12 and at the input to an inverter 12. During precharge, with M12 on, node D is at ground (Vss) and transistors M11-0 . . . M11-X are zero biased.

The output of inverter 12 is referred to as Clksa (or clock sense amplifier), although the particular name for the signal is not important. Clksa could be called a delayed clock signal. While Clksa is low, a block NFET M20 is off. With nodes A and Q high, NFET devices M18 and M19 are on.

However, until blocking transistor M20 is on, neither node A or B can discharge. In the particular embodiment of FIG. 3, charge means to raise voltage and discharge means to lower voltage. In other embodiments, the opposite could be the case.

During the evaluate phase, Clk goes high and transistors M12 and M13 turn off. After a brief delay Clksa goes high so M20 turns on. Assuming each of the inputs Vin0 . . . VinX remain low, node Q remains high and M19 remains on. Node A discharges to ground. As node A falls, M18 begins to turn off and M17 begins to turn on pulling node B high. Vout and Vout* are true and complementary output signals of output stage 62 and domino circuit 50. Vout is low and Vout* is high, on conductors 66 and 68 respectively, indicating that the inputs are all low. Note that 13 and 14 are not necessary but can increase the output voltage drive and allow the transistors of DFG 62 to be smaller.

Now assuming one or more of inputs Vin0 . . . VinX goes high, charge redistributes between nodes Q and D, lowering the voltage of node Q so that M19 turns off. However, because M12 is off, node Q does not discharge full rail to ground. This increases the noise immunity because a higher Vin at one or more of M11-0 . . . M11-X is needed to allow enough charge move between nodes D and Q to turn off M19. If node D were at ground, a smaller Vin could cause M19 to turn off. With M19 off, node A cannot discharge, but node B falls to ground. As node B falls to ground, M16 turns on pulling node A high. (Note that M16 is not necessary, but keeps the input to inverter 14 high.) Vout is high and Vout* is low indicating at least one of the input signals Vin0 . . . VinX is high. Accordingly, DFG 62 acts as a sense amplifier responding to (amplifying) small swing signals on the output of domino stage 54 (node Q), to create full rail (full swing) output signals Vout and Vout*. (Of course, the DFG could use less than full rail inverters to produce low voltage swing outputs if desired.)

A purpose of the delay in M20 turning on after the beginning of the evaluate phase is to allow time for charge from node Q to redistribute to node D during evaluate phase. However, the delay is not necessary and M20 could be tied directly to the Clk signal. The delay between Clk and Clksa is tunable (selected through design). Merely as an example, the delay between Clk and Clksa might be $\frac{1}{10}$th of a cycle or some other value. The delay could be dynamically controlled.

The relative sizing of transistors can affect the noise tolerance. Transistors M16, M17, M18, and M19 may be sized so that if node Q is high, the node A side of DFG 62 is stronger than the node B side. If node Q is low, the node B side of DFG 62 is stronger than the node A side. For example, M19 may be sized larger than M18. However, such sizing may not be required.

There is no static power consumption through evaluate network 58 because during precharge M11-0 . . . M11-X are off and during evaluate M12 is off. In some embodiments, the timing of the turning off of M12 is such that none of M11-0 . . . M11-X can turn on until M12 is off. In other embodiments, one or more of M11-0 . . . M11-X could be momentarily on before M12 is off.

Further, if there is any leakage through one or more of M11-0 . . . M11-X, the voltage of node D will increase creating a reverse bias on M11-0 . . . M11-X, thereby increasing their threshold voltages making it necessary for noise at the input gate to have a higher voltage to turn on one or more of M11-0 . . . M11-X. Reverse biasing reduces leakage. This leakage reduction is referred to herein as active leakage reduction. The amount of leakage is also reduced because M11-0 . . . M11-X are stacked with M12. (Note that it was known by others before the present invention that stacked transistors result in substantially reduced leakage as compared to a single transistor.)

In circuit 50, because of the boosted source, transistors M11-0 . . . M11-X may have lower Vts than would otherwise be acceptable. This offers better delay characteristics than a high Vt implementation. Moreover, the circuit speed is determined to a great extent by the DFG, which can be tuned independently without severely interfering with the domino device sizes. The boosted source design does not necessarily increase fanin capacitance, and hence does not impose any negative impact on the driving capability of the previous datapath stages (not shown). Further, because circuit 50 can produce true and complementary outputs from a single input, it prevents the performance bottlenecks and other disadvantages imposed by dual-rail circuit implementations of wide-fanin OR gates.

B. Domino circuits with a dual stack evaluate network

Figure 4:
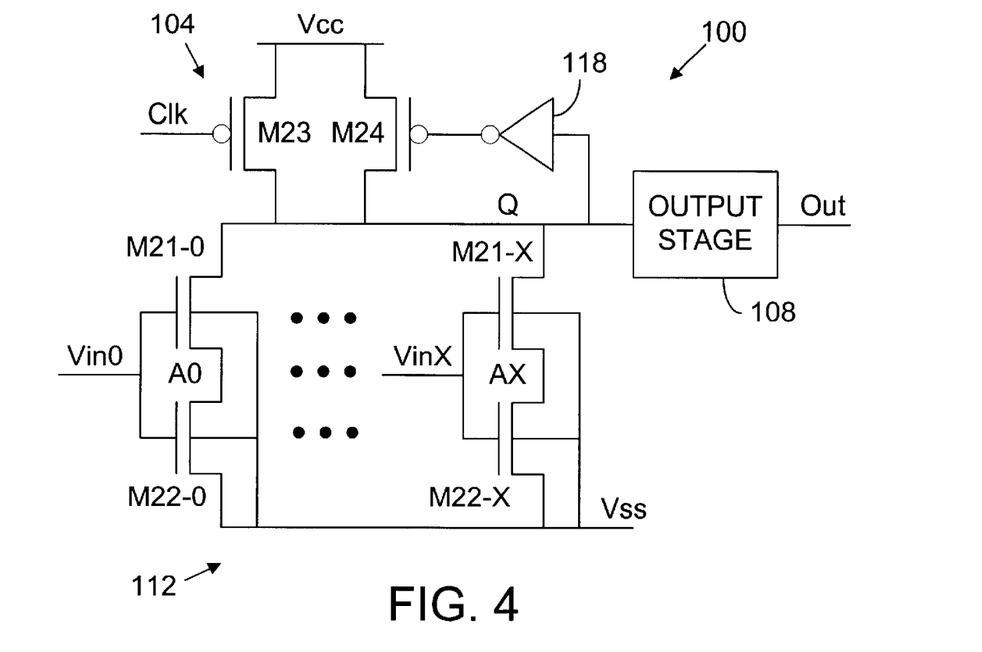
FIG. 4 is a schematic representation of a domino circuit with a dual stack evaluate network according to some embodiments of the invention.

In some embodiments, the invention includes a domino circuit with a dual stack wide-fanin evaluate network. For example, FIG. 4 illustrates a dual stack wide-fanin OR circuit 100 having a domino stage 104 and an output stage 108. Output stage 108 may be various circuits including an inverter as in FIG. 1 or a dual function generator similar to or somewhat different from that of FIG. 3 (in which case it would include Out and Out* signals). Domino stage 104 includes an evaluate network 112, pull-up PFET M23, and a keeper PFET M24 and associated inverter 118.

Evaluate network 112 includes upper NFETs M21-0 . . . M21-X and lower NFETs M22-0 . . . M22-X separated by intermediate nodes A0 . . . AX, respectively. Lower transistors M22-0. . . M22-X may be considered boost transistors because they help boost the voltages of the intermediate nodes. In some embodiments, transistors M21-0 . . . M21-X and M22-0 . . . M22-X may be what is considered low threshold voltage transistors at zero bias, although that is not required. Transistors M21-0 and M22-0 share a data input Vin0, transistors M21-1 and M22-1 (not shown) share a data input Vin1 (not shown), and so forth such that transistors M21-X and M22-X share a data input signal VinX. Merely as an example, X may be 7 or a greater or lesser number. Although circuit 100 is illustrated as an OR gate, those skilled in the art having the benefit of this disclosure could easily implement it in other logic forms such as AND, NOR, and NAND.

During a precharge phase, Clk and data inputs Vin0 . . . VinX are low so that transistors M21-0 . . . M21-X and M22-0 . . . M22-X are off and M23 is on. Nodes A0 . . . AX have inherent capacitance which is charged due to leakage from node Q. Accordingly, M21-0 . . . M21-X are reverse biased because their sources have a voltage higher than their body (which in the illustrated embodiment is at ground, but could be at another voltage). Reverse biasing reduces leakage. This leakage reduction is referred to herein as active leakage reduction. The amount of leakage is also reduced because of the stacked transistors so that Q remains higher.

During the evaluate phase, if all the inputs Vin0 . . . VinX remain low, intermediate nodes A0 . . . AX remain charged to a voltage level slightly higher than ground. Thus, upper transistors M21-0 . . . M21-X remain reverse biased. The threshold voltages of M21-0 . . . M21-X are increased by the reverse bias so that the input voltage signals Vin0 . . . VinX must be greater to turn on transistors M1-0 . . . M1-X, respectively. On the other hand, if one or more of data input signals Vin . . . VinX goes high, the signal Q is discharged through the corresponding transistors in evaluate network 112 as in the prior art. Unlike the prior art circuit of FIG. 2, there is no static power consumption through evaluate network 112.

In circuit 100, because of the capacitance of nodes A0 . . . AX, the transistors of evaluate network 112 may have lower Vts than would otherwise be acceptable. This offers better delay characteristics than a high Vt implementation. The pull-down penalty caused by the stacked transistors can be mitigated by tuning the sizes of the stacked transistors, thus providing an optimal trade-off with other design specifications. However, in some embodiments, the stack evaluate network may increase fanin capacitance, which may mitigate some of the performance improvement achieved by using all low Vt transistors. However, circuit 100 has good decoupling capability like the original domino implementation.

C. Domino circuits with a diode pull-up at the output of the domino stage

Figure 5:
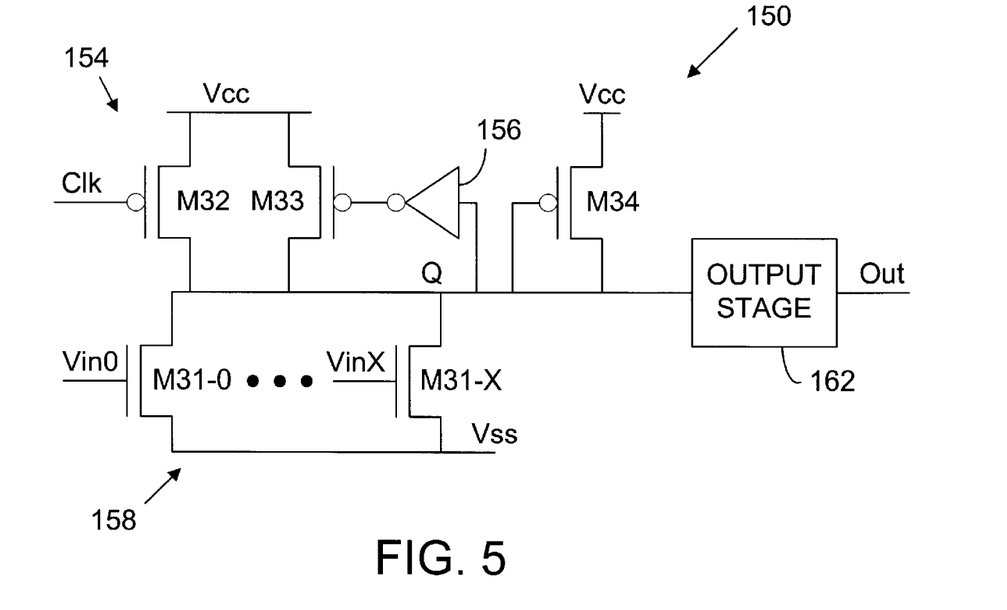
FIG. 5 is a schematic representation of a domino circuit with a diode pull-up at the output of the domino stage according to some embodiments of the invention.

In some embodiments, the invention includes a domino circuit with diode pull-up transistor at the output of the domino stage. For example, FIG. 5 illustrates domino wide-fanin OR circuit 150 having a domino stage 154 and an output stage 162. Output stage 162 may be various circuits including an inverter as in FIG. 1 or a dual function generator similar to or somewhat different from that of FIG. 3. Domino stage 154 includes a wide fan-in evaluate network 158, pull-up PFET M32, and a keeper PFET M33 and associated inverter 118. Domino stage 154 also includes an diode pull-up PFET transistor M34 on a node Q, an output of the domino stage. Node Q carries a domino stage output signal. Evaluate network 158 includes NFET transistors M31-0 . . . M31-X, the gates of which receive data input signals Vin0 . . . VinX. Merely as an example, X may be 7 or a greater or lesser number. Although circuit 150 is illustrated as an OR gate, those skilled in the art having the benefit of this disclosure could easily implement it in other logic forms such as AND, NOR, and NAND.

During a precharge phase, Clk and Vin0 . . . VinX are low so that transistors M31-0 . . . M31-X are off and M32 is on. Accordingly, the domino stage output signal at node Q is pulled high. Diode pull-up transistor M34 is off because $V_{GS}$ of M34 is zero.

During the evaluate phase, Clk goes high so that M32 turns off. As long as node Q is high, keeper PFET M33 is on pulling up node Q. If, one or more data inputs signals Vin0 . . . VinX goes high, the corresponding one(s) of M31-0 . . . M31-X turns on, pulling Q low which turns off M33 turns off. As Q does low, diode transistor M34 turns on. However, diode M34 does not have enough strength to overcome the NFET(s) of evaluate network 158.

If each of inputs Vin0 . . . VinX remain low, node Q remains high and M34 remains off.

However, if there is noise of one or more of inputs Vin0 . . . VinX so that the corresponding one(s) of M31-0 . . . M31-X barely turns on, node Q may start to go low and M34 will start to turn on pulling up Q. Further, M33 will also assist in pulling up Q.

If Vin0 . . . VinX remain low, but there is leakage through one or more of M31-0 . . . M31X, even though $V_{GS}$ of M34 may be less than VT, transistor M34 will be in a subthreshold region of operation that replenishes charge at node Q.

The Vt and size of M34 can be selected to achieve desired noise immunity, speed, and power consumption tradeoffs.

D. Body Biasing

A FET transistor has a zero body bias when its body has the same voltage potential as its source (Vsource). The body voltage of a PFET is referred to as Vbbn, because it has an n-type body and the body voltage of an NFET is referred to as Vbbp, because it has a p-type body. An NFET is forward body biased when Vbbp>Vsource and reversed body biased when Vbbp<Vsource. A PFET is forward body biased when Vbbn<Vsource and reversed body biased when Vbbn>Vsource. When a transistor is forward body biased, its Vt decreases and leakage increases as compared to a zero body bias or reverse body bias. When a transistor is reverse body biased, its Vt increases and leakage decreases as compared to a zero body bias or forward body bias. For the reasons explained above, with increased leakage, circuits tend to have lower noise tolerance. They also tend to have higher performance with a lower Vt. In many cases, performance and noise immunity are traded off.

In some embodiments, the present invention may be used to give higher performance to the circuits described above through applying body biases other than Vss to NFETs and Vcc to PFETs. For example, referring to FIG. 6, a circuit 170 is similar to circuit 50 in FIG. 3, except that the body of the NFETs is tied to bias generation circuitry 172 and the body of the PFETs is tied to bias generation circuitry 174. If Vbbp is greater than Vss, the NFETs would be forward body biased. The NFETs would have a lower Vt and greater leakage. This would tend to give greater performance, but possibly also lower noise tolerance and noise immunity. However, with a forward body biased condition, they may conduct better so that the voltage of intermediate node D could rise more easily and M11-0 . . . M11-X could assume a reverse body biased condition. (Vbbp could be chosen to obtain a desired reverse bias.) With the same noise immunity as the prior art circuits of FIGS. 1 and 2, circuit 170 could have higher performance, or circuit 170 could have better noise immunity and better performance than the prior art circuits.

Figure 7:
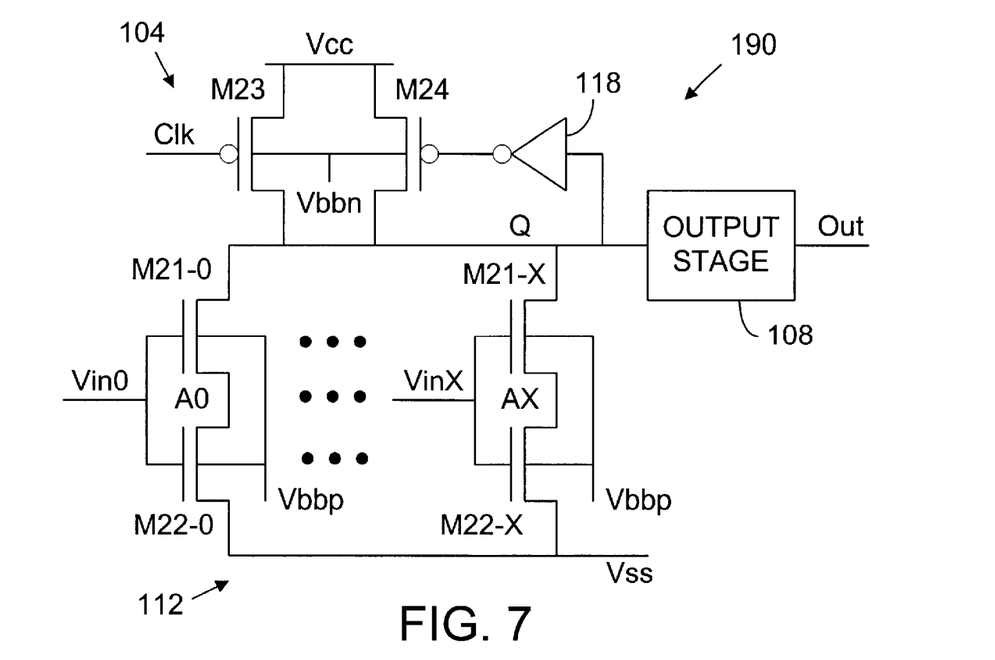
FIG. 7 is a schematic representation of a domino circuit similar to that of FIG. 4 but with body bias voltage circuitry.
Figure 8:
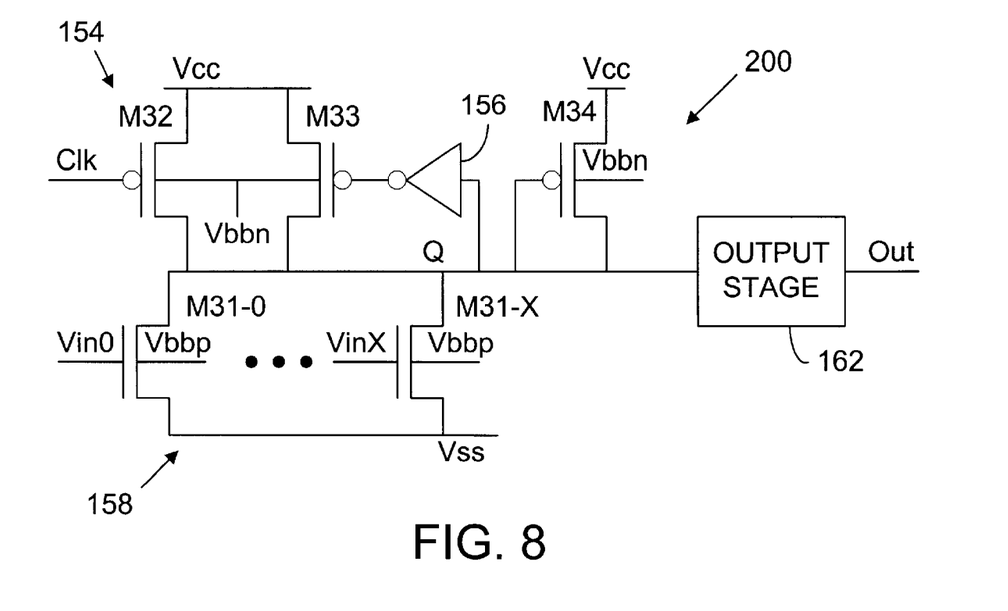
FIG. 8 is a schematic representation of a domino circuit similar to that of FIG. 5 but with body bias voltage circuitry.

FIGS. 7 and 8 show circuits 190 and 200, which are similar to circuits 100 and 150 of FIGS. 4 and 5, except that the body of the NFETs are not necessarily at Vss and the body of the PFETs are not necessarily at Vcc. Bias generation circuitry 172 and bias generation circuitry 174 may be used in connection with circuits 190 and 200.

Figure 6:
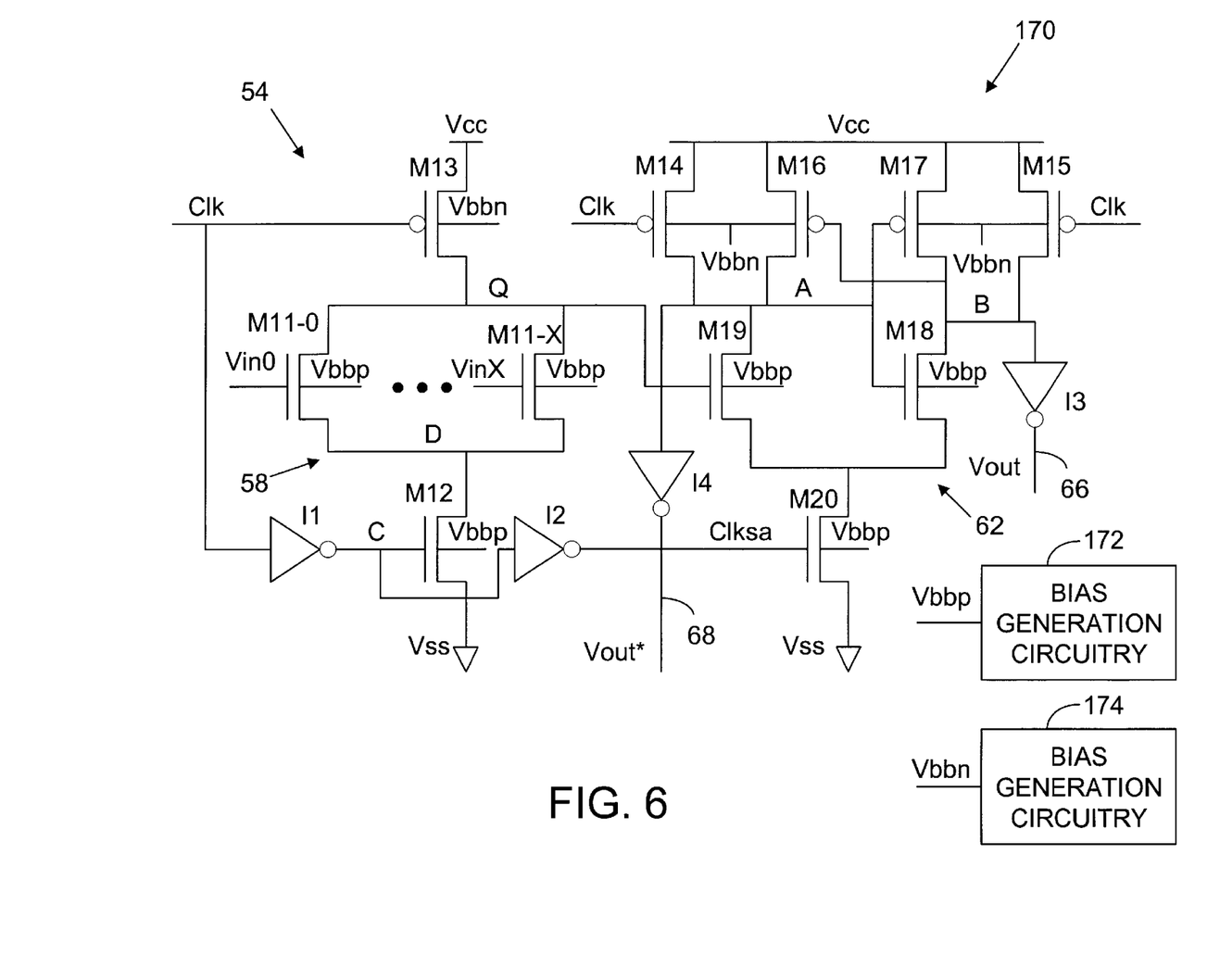
FIG. 6 is a schematic representation of a domino circuit similar to that of FIG. 3 but with body bias voltage circuitry.

Bias generation circuitry 172 and bias generation circuitry 174 may provide voltages to reverse body bias some or all of the transistor of FIGS. 6, 7, and 8 to increase Vt and decrease leakage and increase noise immunity. Circuitry 172 and 174 may provide constant or changing voltages depending on the mode of the circuits. In some circuits, different NFETs could get different body voltages and different PFETs could get different body voltages. For example, transistors M11-0 . . . M11-X might get different body voltages than other NFETs. In some circuits, some NFETs may have their body tied to Vss, while other NFETs have their body at a non-Vss voltage; and some PFETs may have their body tied to Vcc, while other PFETs have their body at a non-Vcc voltage.

In some circuits, where Vcc is relatively low (e.g., 700 millivolts), the body of NFETs may be tied to Vcc, while the body of PFETs may be tied to Vss, to obtain a forward body bias.

It is noted that as described above in connection with circuits 50 and 100 in FIGS. 3 and 4, transistors M11-0 . . . M11-X and M21-0 . . . M21-X may have an intrinsic reverse body biased even though the body of these transistors is at ground.

(Note that it was known by others before the present invention that changing the body voltage with respect to the source voltage could change the bias of the transistor and change the Vt and leakage of the transistor.)

E. Other Information and Embodiments

Different features of the circuits of FIGS. 3–8 can be mixed and matched. For example, the dual stack evaluate network of circuit 100 could be incorporated into circuit 50 and 150.

Figure 9:
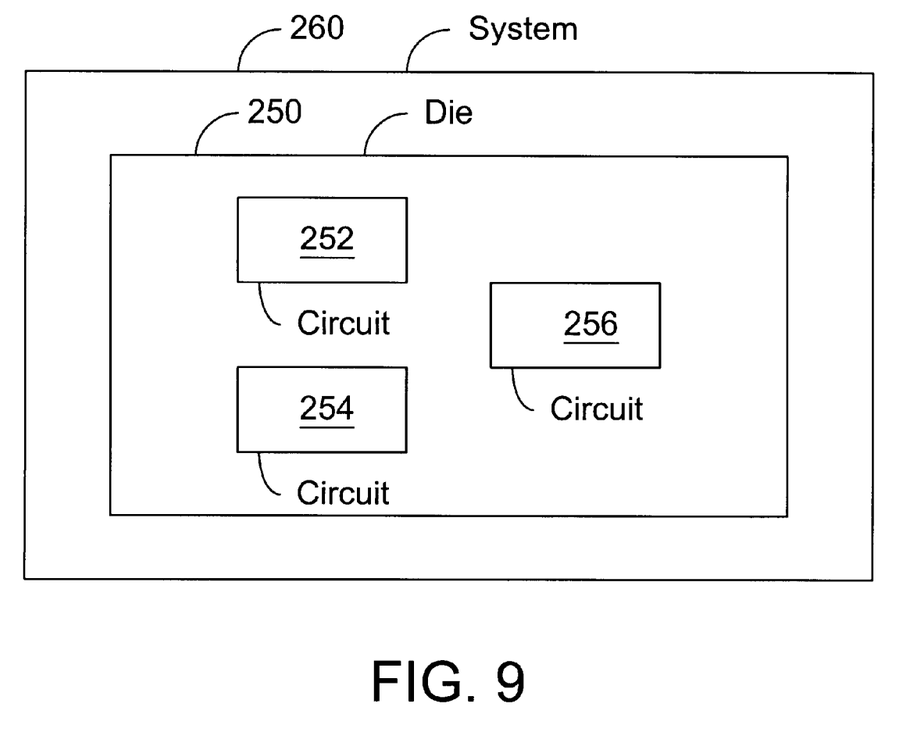
FIG. 9 is block diagram representation of a die in a system that includes domino circuits according to one or more embodiments of the invention.

FIG. 9 illustrates a semiconductor die 250, that includes many circuits, of which circuits 252, 254, and 256 are examples. Circuits 252, 254, and 256 may be any one of circuits of FIGS. 3–8 or other circuits. Die 250 could be for any of a various types of electrical devices including a microprocessor, DSP (digital signal processor), embedded controller, ASIC (application specific integrated circuit), in connection with register files, chipset, networking, communications including (RF) radio frequency, etc. Referring to FIG. 9, die 250 is part of a system 260, which may be a personal computer, mainframe computer, computer with a DSP, microcomputer, hand held computer, communication system, or a variety of other systems.

As used herein, Vcc and Vss are examples of power supply and ground voltages. However, the power supply and ground voltages of circuits of FIGS. 3–8 may be, but do not have to be, the same power supply and ground voltages as are used by other circuits in die 250. Also, as is well known, power supply and ground voltages are not necessarily constant, but rather have fluctuations because of noise or other reasons.

Although in the illustrated examples, node Q is high during precharge and data input signals Vin and the output stage output signal Vout are low during precharge, this is not required.

FETs other than MOSFETs could be used. Although the illustrated embodiments include enhancement mode transistors, depletion mode transistors could be used with modifications to the circuit which would be apparent to those skilled in the art having the benefit of this disclosure.

Circuits according to the present invention could include additional structure not illustrated in the present drawings.

If the specification states a component, feature, structure, or characteristic "may", "might", or "could" be included, that particular component, feature, structure, or characteristic is not required to be included. Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A die comprising:
   domino circuits at least some of which include:
   an output stage; and
   a domino stage including a domino stage output node coupled to the output stage, the domino stage including a wide-fanin evaluate network including the domino stage output node and at least one intermediate node in an evaluate path of the evalute network, the domino stage having transistors to be reverse body biased in the evaluate network by raising voltage of the at least one intermediate node without static power consumption through the evaluate network.

2. The die of claim 1, wherein the at least one intermediate node is only one intermediate node and the intermediate node is between the reverse body biased transistors and a boost transistor.

3. The die of claim 1, wherein the evaluate network is a dual stack evaluate network having upper transistors, which are the reverse body biased transistors, and lower transistors, and wherein the at least one intermediate node are intermediate nodes between upper and lower transistors.

4. The die of claim 1, wherein the domino stage further includes a diode pull-up transistor having a gate and drain connected to the domino stage output node.

5. The die of claim 1, further comprising bias voltage generators to provide a bias voltage to at least some transistors of the domino circuits.

6. The die of claim 1, wherein transistors of the evaluate network have a body at a voltage higher than the ground voltage of the circuit to be forward body biased when the at least one intermediate node is at ground voltage.

7. The die of claim 1, wherein the output stage is a dual function generator.

8. A die comprising:
    domino circuits at least some of which include:
        a dual function generator output stage; and
        a domino stage including a domino stage output node coupled to the dual function generator output stage, the domino stage including an evaluate network including the domino stage output node and an intermediate node connected to a boost transistor, and during an evaluate phase that the intermediate node is isolated so that the domino stage output node cannot discharge full rail.

9. The die of claim 8, wherein there is no static power consumption through the evaluate network.

10. The die of claim 8, wherein the dual function generator output stage includes a blocking transistor having a gate to receive a delayed clock signal, and the blocking transistor prevents the dual function generator output stage from responding to a domino stage output signal on the domino stage output node until the delayed clock signal is received.

11. The die of claim 8, wherein delay of the delayed clock signal is tuned to allow time for redistribution of charge between the domino stage output node and the intermediate node.

12. The die of claim 8, wherein the dual function generator output stage is a sense amplifier that amplifies less than full rail voltage changes on the domino stage output node to full rail true and complementary output signals.

13. The die of claim 8, wherein the domino stage further includes a diode transistor having a gate and an additional terminal connected to the domino stage output node.

14. The die of claim 8, wherein the intermediate node is connected only to the boost transistor and the evaluate network.

15. The die of claim 8, wherein transistors of the evaluate network have a body at a voltage higher than the ground voltage of the circuit to be forward body biased when the intermediate node is at ground voltage.

16. A die comprising:
    domino circuits at least some of which include:
        an output stage; and
        a domino stage including a domino stage output node coupled to the output stage, the domino stage including the domino stage output node and a dual stack evaluate network having upper transistors, lower transistors, and intermediate nodes between the upper and lower transistors, and wherein the upper transistors are reverse body biased through raising voltage of the intermediate nodes.

17. The die of claim 16, wherein there is no static power consumption through the evaluate network.

18. The die of claim 16, wherein the upper and lower transistors have a body at ground.

19. The die of claim 16, wherein respective ones of the upper and lower transistors share an data input signal at their gates.

20. The die of claim 16, further comprising bias voltage generators to provide a bias voltage to at least some transistors of the domino circuits.

21. The die of claim 16, wherein transistors of the evaluate network have a body at a voltage higher than the ground voltage of the circuit to be forward body biased when the intermediate nodes are at ground voltage.

22. The die of claim 16, wherein the domino stage further includes a diode transistor having a gate and an additional terminal connected to the domino stage output node.

* * * * *